United States Patent
Ueno et al.

(10) Patent No.: US 12,286,569 B2
(45) Date of Patent: Apr. 29, 2025

(54) ADHESIVE SHEET

(71) Applicant: NITTO DENKO CORPORATION, Ibaraki (JP)

(72) Inventors: Shusaku Ueno, Ibaraki (JP); Takumi Yutou, Ibaraki (JP); Takamasa Hirayama, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 552 days.

(21) Appl. No.: 17/269,580

(22) PCT Filed: Aug. 19, 2019

(86) PCT No.: PCT/JP2019/032257
§ 371 (c)(1),
(2) Date: Feb. 19, 2021

(87) PCT Pub. No.: WO2020/049985
PCT Pub. Date: Mar. 12, 2020

(65) Prior Publication Data
US 2021/0309889 A1 Oct. 7, 2021

(30) Foreign Application Priority Data
Sep. 6, 2018 (JP) .................................. 2018-166993

(51) Int. Cl.
C09J 7/38 (2018.01)
C09J 11/08 (2006.01)
(Continued)

(52) U.S. Cl.
CPC ................ *C09J 7/38* (2018.01); *C09J 11/08* (2013.01); *C09J 125/10* (2013.01); *C09J 153/02* (2013.01);
(Continued)

(58) Field of Classification Search
None
See application file for complete search history.

(56) References Cited

U.S. PATENT DOCUMENTS 7,635,516 B2 12/2009 Arimitsu et al.
8,906,989 B2 * 12/2014 Watanabe ................ C09J 7/385
524/159
(Continued)

FOREIGN PATENT DOCUMENTS

CN 1930262 A 3/2007
CN 105647413 A 6/2016
(Continued)

OTHER PUBLICATIONS

Machine translation of JP-2016108353-A (Year: 2016).*
(Continued)

*Primary Examiner* — Frank D Ducheneaux
(74) *Attorney, Agent, or Firm* — Sughrue Mion, PLLC

(57) ABSTRACT

Provided is a pressure-sensitive adhesive sheet that may be used for the grinding of a hard and brittle substrate in a backgrinding step for the hard and brittle substrate, the pressure-sensitive adhesive sheet being excellent in all of grinding accuracy, low contamination property, productivity, and fixing property. The pressure-sensitive adhesive sheet of the present invention includes a pressure-sensitive adhesive layer, wherein the pressure-sensitive adhesive layer contains: a pressure-sensitive adhesive containing a base polymer; and a foaming agent having a foaming temperature of 90° C. or more, and wherein the pressure-sensitive adhesive sheet has, when a pressure-sensitive adhesive surface thereof is bonded to a silicon chip, a shear adhesive strength of 1.0 MPa or more under an ambient temperature of 25° C., and a shear adhesive strength of 0.2 MPa or more under an ambient temperature of 80° C.

13 Claims, 1 Drawing Sheet

(51) Int. Cl.
  *C09J 125/10* (2006.01)
  *C09J 153/02* (2006.01)
  *H01L 21/304* (2006.01)
  *H01L 21/683* (2006.01)

(52) U.S. Cl.
  CPC ........ *H01L 21/304* (2013.01); *H01L 21/6836* (2013.01); *C09J 2203/326* (2013.01); *C09J 2301/124* (2020.08); *C09J 2301/312* (2020.08); *C09J 2301/408* (2020.08); *C09J 2301/412* (2020.08); *C09J 2301/502* (2020.08); *C09J 2400/24* (2013.01); *C09J 2453/00* (2013.01); *H01L 2221/68318* (2013.01); *H01L 2221/68327* (2013.01); *H01L 2221/6834* (2013.01); *H01L 2221/68381* (2013.01)

(56) References Cited

U.S. PATENT DOCUMENTS

| 2008/0160293 | A1 | 7/2008 | Arimitsu et al. |
| 2021/0309889 | A1 | 10/2021 | Ueno et al. |

FOREIGN PATENT DOCUMENTS

| JP | 2001-138232 | A | | 5/2001 | |
| JP | 2011-151163 | A | | 8/2011 | |
| JP | 2014074173 | A | * | 4/2014 | ......... B32B 37/0015 |
| JP | 2016-003245 | A | | 1/2016 | |
| JP | 2016-108353 | A | | 6/2016 | |
| JP | 2016-112640 | A | | 6/2016 | |
| JP | 2017-197670 | A | | 11/2017 | |
| TW | 1732286 | B | | 7/2021 | |
| WO | 2005/087888 | A1 | | 9/2005 | |

OTHER PUBLICATIONS

Machine translation of JP 2014074173 A (Year: 2014).*
Notice of Reasons for Refusal dated May 17, 2022 from the Japanese Patent Office in Japanese Application No. 2018-166993.
International Search Report of PCT/JP2019/032257 dated Nov. 5, 2019 [PCT/ISA/210].
Taiwanese Office Action dated Nov. 26, 2020, issued in corresponding Taiwanese Patent Application No. 108131670.
Office Action dated Oct. 7, 2021 from the Taiwanese Intellectual Property Office in TW Application No. 110123879.

* cited by examiner

ADHESIVE SHEET

CROSS REFERENCE TO RELATED APPLICATIONS

This application is a National Stage of International Application No. PCT/JP2019/032257 filed on Aug. 19, 2019, claiming priority based on Japanese Patent Application No. 2018-166993 filed on Sep. 6, 2018.

TECHNICAL FIELD

The present invention relates to a pressure-sensitive adhesive sheet.

BACKGROUND ART

In recent years, there has been an increasing need to accurately manufacture a ceramic substrate that is hard and brittle (hereinafter collectively referred to as "hard and brittle substrate"), such as: a sapphire substrate in use for, for example, a cover glass of an electronic device, a smartphone, or a timepiece, such as a substrate for a white LED or silicon on sapphire (SOS); a silicon carbide substrate, a gallium nitride substrate, a gallium oxide substrate, or a diamond substrate, which is expected to serve as a substrate for a power semiconductor; a silicon nitride substrate or an alumina nitride substrate, which is used as a heat-dissipating circuit board material for a power semiconductor; and a quartz substrate to be used for, for example, a crystal oscillator of glass or a lens. In a typical example of a process for manufacturing such substrate, a backgrinding step of grinding a back surface of the substrate (wafer) to a desired thickness is performed. In this step, a wax or a pressure-sensitive adhesive sheet (backgrinding tape) is used in order to fix the substrate.

Such substrate as described above (hard and brittle substrate) has high hardness. When the hard and brittle substrate having high hardness is ground, the body to be ground (hard and brittle substrate) needs to be thinned by rotating a grinder while pressing fixed abrasive grains or loose abrasive grains, each of which is made of diamond or the like, against the body to be ground at a high load. Hitherto, in such step, a wax has been frequently used as a fixing material excellent in grindability. However, when the wax is used, a cleaning step involving using a large amount of a solvent needs to be performed to remove the wax after the grinding, and hence there arise problems with a contamination property and productivity.

As a method capable of solving the problems with the contamination property and productivity, there is known a method involving fixing the body to be ground with a pressure-sensitive adhesive sheet. In the backgrinding step for a silicon substrate (wafer) that is relatively easy to subject to grinding processing, the pressure-sensitive adhesive sheet is in actual use (for example, Patent Literature 1). However, in the backgrinding step for the hard and brittle substrate, grinding is performed at a high load as described above, and hence the following problem arises: extremely large frictional resistance occurs between the body to be ground (hard and brittle substrate) and the grinder, resulting in a reduction in pressure-sensitive adhesive strength of the pressure-sensitive adhesive sheet due to frictional heat, and hence the body to be ground (hard and brittle substrate) cannot be sufficiently fixed. Meanwhile, when a pressure-sensitive adhesive sheet showing a strong pressure-sensitive adhesive property under high temperature is used, there arise problems such as: an increase in peel strength; occurrence of an adhesive residue; and a resulting need to clean the body to be ground (hard and brittle substrate) that is contaminated with the adhesive residue.

CITATION LIST

Patent Literature

[PTL 1] JP 2011-151163 A

SUMMARY OF INVENTION

Technical Problem

The present invention has been made in order to solve the problems of the related art described above, and an object of the present invention is to provide a pressure-sensitive adhesive sheet that may be used for the grinding of a hard and brittle substrate in a backgrinding step for the hard and brittle substrate, the pressure-sensitive adhesive sheet being excellent in all of grinding accuracy, low contamination property, productivity, and fixing property.

Solution to Problem

According to one embodiment of the present invention, there is provided a pressure-sensitive adhesive sheet, including a pressure-sensitive adhesive layer, wherein the pressure-sensitive adhesive layer contains: a pressure-sensitive adhesive containing a base polymer; and a foaming agent having a foaming temperature of 90° C. or more, and wherein the pressure-sensitive adhesive sheet has, when a pressure-sensitive adhesive surface thereof is bonded to a silicon chip, a shear adhesive strength of 1.0 MPa or more under an ambient temperature of 25° C., and a shear adhesive strength of 0.2 MPa or more under an ambient temperature of 80° C.

In one embodiment, the pressure-sensitive adhesive layer has a microhardness H of from 10 MPa to 1 GPa at 25° C.

In one embodiment, the base polymer contained in the pressure-sensitive adhesive is a thermoplastic elastomer.

In one embodiment, the thermoplastic elastomer is a styrene-based elastomer.

In one embodiment, the pressure-sensitive adhesive further contains a tackifying resin.

In one embodiment, a content of the tackifying resin is from 20 parts by weight to 350 parts by weight with respect to 100 parts by weight of the base polymer.

In one embodiment, the pressure-sensitive adhesive further contains a surfactant.

In one embodiment, a content of the surfactant is from 0.001 part by weight to 15 parts by weight with respect to 100 parts by weight of the base polymer.

In one embodiment, the foaming agent is thermally expandable microspheres.

In one embodiment, a content of the thermally expandable microspheres is from 20 parts by weight to 210 parts by weight with respect to 100 parts by weight of the base polymer.

In one embodiment, the pressure-sensitive adhesive sheet further includes a base material arranged on at least one side of the pressure-sensitive adhesive layer.

In one embodiment, the pressure-sensitive adhesive sheet further includes another pressure-sensitive adhesive layer arranged on at least one side of the pressure-sensitive adhesive layer.

In one embodiment, the base material is arranged between the pressure-sensitive adhesive layer and the another pressure-sensitive adhesive layer.

In one embodiment, the pressure-sensitive adhesive sheet is for use as a temporary fixing material during substrate processing in a semiconductor manufacturing process.

According to another embodiment of the present invention, there is provided a method of grinding a substrate. The method of grinding a substrate includes placing and fixing a substrate onto a pressure-sensitive adhesive layer of a pressure-sensitive adhesive sheet including the pressure-sensitive adhesive layer, and then grinding a surface of the substrate on an opposite side to a pressure-sensitive adhesive layer side, the pressure-sensitive adhesive layer containing: a pressure-sensitive adhesive containing a base polymer; and a foaming agent having a foaming temperature of 90° C. or more, the pressure-sensitive adhesive sheet having, when a pressure-sensitive adhesive surface thereof is bonded to a silicon chip, a shear adhesive strength of 1.0 MPa or more under an ambient temperature of 25° C., and a shear adhesive strength of 0.2 MPa or more under an ambient temperature of 80° C.

According to still another embodiment of the present invention, there is provided a method of manufacturing a chip. The method of manufacturing a chip includes a grinding step including placing and fixing a substrate onto a pressure-sensitive adhesive layer of a pressure-sensitive adhesive sheet including the pressure-sensitive adhesive layer, and then grinding a surface of the substrate on an opposite side to a pressure-sensitive adhesive layer side, the pressure-sensitive adhesive layer containing: a pressure-sensitive adhesive containing a base polymer; and a foaming agent having a foaming temperature of 90° C. or more, the pressure-sensitive adhesive sheet having, when a pressure-sensitive adhesive surface thereof is bonded to a silicon chip, a shear adhesive strength of 1.0 MPa or more under an ambient temperature of 25° C., and a shear adhesive strength of 0.2 MPa or more under an ambient temperature of 80° C.

Advantageous Effects of Invention

According to the present invention, the pressure-sensitive adhesive sheet that may be used for the grinding of a hard and brittle substrate in a backgrinding step for the hard and brittle substrate, the pressure-sensitive adhesive sheet being excellent in all of grinding accuracy, low contamination property, productivity, and fixing property, can be provided.

DESCRIPTION OF EMBODIMENTS

A. Outline of Pressure-Sensitive Adhesive Sheet

Figure 1:
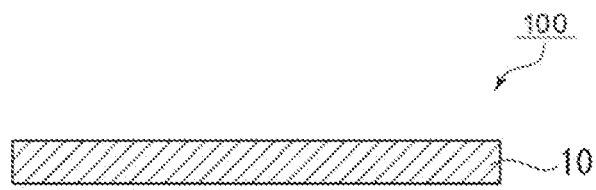
FIG. 1(a), FIG. 1(b), and FIG. 1(c) are each a schematic cross-sectional view of a pressure-sensitive adhesive sheet according to one embodiment of the present invention.
Figure 1:
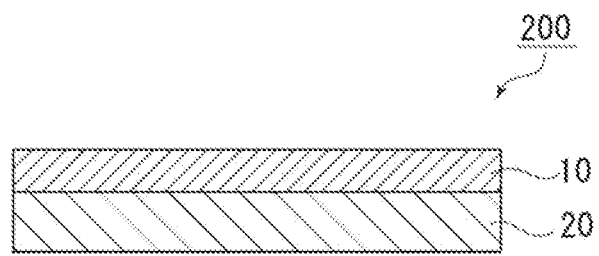
Figure 1:
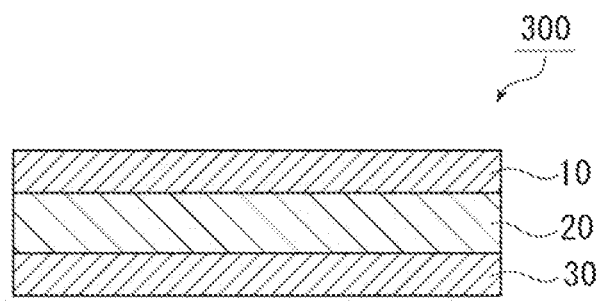

FIG. 1(a) is a schematic cross-sectional view of a pressure-sensitive adhesive sheet according to one embodiment of the present invention. A pressure-sensitive adhesive sheet 100 includes a pressure-sensitive adhesive layer 10. The pressure-sensitive adhesive sheet of the present invention may consist only of the pressure-sensitive adhesive layer 10, or may further include any appropriate layer in addition to the pressure-sensitive adhesive layer.

FIG. 1(b) is a schematic cross-sectional view of a pressure-sensitive adhesive sheet according to another embodiment of the present invention. A pressure-sensitive adhesive sheet 200 includes the pressure-sensitive adhesive layer 10 and a base material 20 arranged on at least one side of the pressure-sensitive adhesive layer 10. FIG. 1(c) is a schematic cross-sectional view of a pressure-sensitive adhesive sheet according to still another embodiment of the present invention. A pressure-sensitive adhesive sheet 300 includes the pressure-sensitive adhesive layer 10 and another pressure-sensitive adhesive layer 30 arranged on at least one side of the pressure-sensitive adhesive layer 10. The base material 20 may be arranged between the pressure-sensitive adhesive layer 10 and the other pressure-sensitive adhesive layer 30 as in the illustrated example, or the pressure-sensitive adhesive sheet may be formed of the pressure-sensitive adhesive layer and the other pressure-sensitive adhesive layer with the base material being omitted (not shown). In addition, the pressure-sensitive adhesive sheet may further include the following layers (not shown) as layers other than the pressure-sensitive adhesive layer: an elastic layer (to be described later in the section E), which is capable of imparting elasticity to the pressure-sensitive adhesive sheet; a separator (to be described later in the section F), which is peelably arranged on the pressure-sensitive adhesive layer; and the like.

The pressure-sensitive adhesive layer included in the pressure-sensitive adhesive sheet of the present invention contains: a pressure-sensitive adhesive containing a base polymer; and a foaming agent (preferably thermally expandable microspheres; details thereof are described later). The foaming agent can foam at a predetermined temperature (foaming starting temperature: 90° C. or more). Unevenness occurs on the pressure-sensitive adhesive surface (i.e., pressure-sensitive adhesive layer surface) of the pressure-sensitive adhesive layer containing such foaming agent through the foaming of the foaming agent by heating, with the result that its pressure-sensitive adhesive strength is decreased or lost. When the pressure-sensitive adhesive sheet of the present invention is used as, for example, a sheet for fixing a body to be ground in a backgrinding step, the required pressure-sensitive adhesive property is expressed during grinding, and satisfactory peelability is expressed through the decrease or loss of the pressure-sensitive adhesive strength by heating in the peeling of the pressure-sensitive adhesive sheet from the ground body after the grinding.

The pressure-sensitive adhesive sheet of the present invention has, when the pressure-sensitive adhesive surface thereof is bonded to a silicon chip, a shear adhesive strength under an ambient temperature of 25° C. of 1.0 MPa or more, preferably 1.5 MPa or more, more preferably 2.0 MPa or more, still more preferably 2.3 MPa or more, particularly preferably 3 MPa or more. The shear adhesive strength under an ambient temperature of 25° C. is preferably as high as possible, but its upper limit is, for example, 8 MPa. Herein, the shear adhesive strength may be measured by: fixing a silicon chip to the pressure-sensitive adhesive layer surface serving as a bonding surface by thermocompression bonding under the bonding conditions of 100° C. and 0.1 MPa for 1 minute with a heat pressing machine; using Dage 4000 manufactured by Nordson Corporation to apply an external force in a horizontal direction to the chip at a shear rate of 500 μm/sec. with a measuring terminal being set to a position at a height of 50 μm from the bonded surface; and reading the maximum breaking load from the thus obtained load-displacement curve. When a sample of interest is a single-sided tape, the measurement is performed under a state in which the sample is fixed by bonding the back surface of the base material (surface thereof on the opposite side to the pressure-sensitive adhesive layer) to a predetermined base with a double-sided tape NO. 585 manufactured by Nitto Denko Corporation.

The pressure-sensitive adhesive sheet of the present invention has, when the pressure-sensitive adhesive surface thereof is bonded to a silicon chip, a shear adhesive strength under an ambient temperature of 80° C. of 0.2 MPa or more, preferably 0.3 MPa or more, more preferably 0.4 MPa or more, still more preferably 0.5 MPa or more, particularly preferably 0.7 MPa or more. The upper limit of the shear adhesive strength under an ambient temperature of 80° C. is, for example, 5 MPa. Herein, the shear adhesive strength under an ambient temperature of 80° C. is a shear adhesive strength measured by the above-mentioned method after an evaluation sample formed by bonding the pressure-sensitive adhesive sheet to a silicon chip has been left to stand under an environment at 80° C. for 5 minutes.

In the present invention, by virtue of setting the shear adhesive strength to fall within the above-mentioned ranges, there can be obtained a pressure-sensitive adhesive sheet suitable for the fixation of an adherend to be subjected to friction at a high load to have high temperature. In addition, by virtue of incorporating the foaming agent that can foam at a temperature equal to or higher than a predetermined temperature into the pressure-sensitive adhesive layer, there can be obtained a pressure-sensitive adhesive sheet that, while expressing such high shear adhesive strength as described above in a situation in which the adherend needs to be fixed, allows the adherend to be easily peeled therefrom through heating in a situation in which the adherend needs to be peeled therefrom. The pressure-sensitive adhesive sheet of the present invention is suitably used as a temporary fixing material during substrate processing in a semiconductor manufacturing process (e.g., during the grinding of a hard and brittle substrate). More specifically, the pressure-sensitive adhesive sheet of the present invention may be used, in a backgrinding step for a hard and brittle substrate, as a temporary fixing material for the hard and brittle substrate. In one embodiment, a sapphire wafer is used as the hard and brittle substrate. The use of the pressure-sensitive adhesive sheet of the present invention in the backgrinding step enables backgrinding to be performed with good grinding accuracy by preventing a defect, such as detachment or floating, even when the hard and brittle substrate is caused to have high temperature by friction during the grinding. In addition, after the backgrinding, the hard and brittle substrate can be easily peeled from the pressure-sensitive adhesive sheet by heating the pressure-sensitive adhesive sheet to a temperature equal to or higher than a predetermined temperature (e.g., the foaming starting temperature of the foaming agent+10° C. to 40° C.). After that, the hard and brittle substrate has high cleanliness, and hence can omit a cleaning step, which is required when the backgrinding is performed using a wax, or can remarkably reduce the use amount of a solvent even when the cleaning step is needed. The shear adhesive strength of the pressure-sensitive adhesive sheet may be adjusted on the basis of, for example, the kind of the pressure-sensitive adhesive contained in the pressure-sensitive adhesive layer, the structure of the base polymer for forming the pressure-sensitive adhesive, and the kind and amount of an additive to be added to the pressure-sensitive adhesive.

The pressure-sensitive adhesive sheet of the present invention may, while bonded to an object to be processed, be subjected to one or a combination of: the backgrinding step; a resin encapsulation step; a step of treating the back surface (ground surface) of the substrate (wafer), such as vapor deposition or sputtering; a dicing step; and a breaking step.

The pressure-sensitive adhesive sheet has a shear adhesive strength for a silicon chip after the foaming of the foaming agent of preferably 0.2 MPa or less, more preferably 0.1 MPa or less. The shear adhesive strength after the foaming of the foaming agent may be measured after a measurement sample after heating has been returned to ordinary temperature (25° C.).

The thickness of the pressure-sensitive adhesive sheet of the present invention is preferably from 5 µm to 500 µm, more preferably from 10 µm to 300 µm, still more preferably from 15 µm to 300 µm.

According to another aspect of the present invention, there is provided a method of grinding a substrate through use of the pressure-sensitive adhesive sheet. This method includes, for example, placing and fixing a substrate onto the pressure-sensitive adhesive layer of the pressure-sensitive adhesive sheet, and then grinding the surface of the substrate on the opposite side to a pressure-sensitive adhesive layer side. Any appropriate method may be adopted for the grinding of the substrate. The grinding may be performed for the purpose of, for example, causing the substrate to have a desired thickness. In one embodiment, a wafer having a circular shape or an orientation flat shape may be used as the substrate. In addition, for example, a hard and brittle substrate (wafer), such as a sapphire substrate (sapphire wafer), may be used as the substrate.

According to still another aspect of the present invention, there is provided a method of manufacturing a chip through use of the pressure-sensitive adhesive sheet. This manufacturing method includes, for example, a grinding step including placing and fixing a substrate onto the pressure-sensitive adhesive layer of the pressure-sensitive adhesive sheet, and then grinding the surface of the substrate on the opposite side to a pressure-sensitive adhesive layer side. For example, a wafer having a circular shape or an orientation flat shape may be used as the substrate. In addition, the manufacturing method may include any appropriate step in addition to the grinding step. The manufacturing method may include, for example, a dicing step of cutting the substrate (wafer), a breaking step of dividing the cut body into chips after the dicing, a step of treating the back surfaces (ground surfaces) of the chips, such as vapor deposition or sputtering, and an encapsulation step of encapsulating each of the chips in a resin. Examples of the chips include LED chips each using, as a support, a hard and brittle wafer, such as a sapphire wafer.

B. Pressure-Sensitive Adhesive Layer

The pressure-sensitive adhesive layer contains a pressure-sensitive adhesive for imparting a pressure-sensitive adhesive property, and a foaming agent.

The microhardness H of the pressure-sensitive adhesive layer at 25° C. is preferably from 10 MPa to 1 GPa, more preferably from 12 MPa to 0.8 GPa, still more preferably from 15 MPa to 0.4 GPa. When the microhardness H falls within such ranges, there can be obtained a pressure-sensitive adhesive sheet that enables backgrinding to be performed with excellent grinding accuracy. In addition, the microhardness H of the pressure-sensitive adhesive layer at 80° C. is preferably from 0.03 MPa to 50 MPa, more preferably from 0.05 MPa to 40 MPa, still more preferably from 0.1 MPa to 30 MPa. When the microhardness H falls within such ranges, there can be obtained a pressure-sensitive adhesive sheet that enables backgrinding of a hard and brittle substrate (e.g., a sapphire wafer) to be performed with excellent grinding accuracy. The microhardness H is obtained by: perpendicularly pressing a Berkovich (triangular pyramid-shaped) probe made of diamond against the surface (at a site where the foaming agent is not present) of the pressure-sensitive adhesive layer; and subjecting the thus obtained displacement-load hysteresis curve to numerical processing with software (TriboScan) included with a measurement apparatus. Herein, the microhardness H is a microhardness H measured with a nanoindenter (Triboindenter TI-950 manufactured by Hysitron, Inc.) by a single indentation method at a predetermined temperature (25° C. or 80° C.) under the measurement conditions of an indentation speed of about 500 nm/sec and an indentation depth of about 3,000 nm. The microhardness H of the pressure-sensitive adhesive layer may be adjusted on the basis of, for example, the kind of the pressure-sensitive adhesive contained in the pressure-sensitive adhesive layer, the structure of the base polymer for forming the pressure-sensitive adhesive, and the kind and amount of an additive to be added to the pressure-sensitive adhesive.

The thickness of the pressure-sensitive adhesive layer is preferably from 5 μm to 300 μm, more preferably from 15 μm to 250 μm, still more preferably from 20 μm to 100 μm, particularly preferably from 20 μm to 70 μm.

B-1. Pressure-Sensitive Adhesive

Any appropriate pressure-sensitive adhesive may be used as the pressure-sensitive adhesive for forming the pressure-sensitive adhesive layer as long as the effects of the present invention are obtained. Examples of the pressure-sensitive adhesive include pressure-sensitive adhesives containing, as a base polymer (pressure-sensitive adhesive resin), a thermoplastic elastomer, an acrylic resin, a silicone-based resin, a vinyl alkyl ether-based resin, a polyester-based resin, a polyamide-based resin, a urethane-based resin, a fluorinated resin, and the like. The pressure-sensitive adhesive preferably contains, as a base polymer, a thermoplastic resin. A pressure-sensitive adhesive containing, as a base polymer, a thermoplastic elastomer is preferably used. A styrene-based elastomer is preferably used as the thermoplastic elastomer. For example, when the styrene-based elastomer is used, the shear adhesive strength and the microhardness H can be easily controlled by adjusting the ratio of a styrene unit.

Examples of the styrene-based elastomer include a styrene-butadiene copolymer (SB), a styrene-isoprene copolymer (SI), a styrene-isoprene-styrene block copolymer (SIS), a styrene-butadiene-styrene block copolymer (SBS), a styrene-isobutylene-styrene copolymer (SIBS), a styrene-ethylene-butylene-styrene block copolymer (SEBS), a styrene-ethylene-propylene block copolymer (SEP), a styrene-ethylene-propylene-styrene block copolymer (SEPS), and modified products thereof. Of those, SEBS, SBS, SIS, and SIBS are preferred. Those copolymers are each preferably a block copolymer.

The content ratio of a constituent unit derived from styrene in the styrene-based elastomer is preferably from 10 parts by weight to 75 parts by weight, more preferably from 20 parts by weight to 70 parts by weight, still more preferably from 20 parts by weight to 50 parts by weight with respect to 100 parts by weight of the styrene-based elastomer. When the content ratio falls within such ranges, a pressure-sensitive adhesive layer having moderate elasticity and being excellent in pressure-sensitive adhesive property can be formed to provide a pressure-sensitive adhesive sheet that enables backgrinding to be performed with excellent grinding accuracy. In addition, there can be obtained a pressure-sensitive adhesive sheet that, when heated to a temperature equal to or higher than the foaming starting temperature of the foaming agent, moderately softens so as not to inhibit the expansion of the foaming agent, and hence can express excellent peelability.

In one embodiment, an acid-modified styrene-based elastomer (preferably acid-modified SEBS, SBS, SIS, or SIBS) is used as the styrene-based elastomer. Examples of the acid to be used for the acid modification include maleic acid and maleic anhydride, and maleic acid modification is preferred. When the acid-modified styrene-based elastomer is used, the use of a cross-linking agent (e.g., an epoxy-based cross-linking agent) in combination therewith enables the adjustment of a molecular weight or the formation of a cross-linked structure, and hence the modulus of elasticity of the pressure-sensitive adhesive in a region of temperatures equal to or higher than the foaming starting temperature can be easily controlled. The acid value of the acid-modified styrene-based elastomer is preferably 5 mg ($CH_3ONa$)/g or more, more preferably 7 mg ($CH_3ONa$)/g or more, still more preferably from 7 mg ($CH_3ONa$)/g to 25 mg ($CH_3ONa$)/g. The acid value in this case means the weight (mg) of sodium methoxide ($CH_3ONa$) that neutralizes 1 g of the base polymer. In addition, the acid value of the base polymer may be measured in conformity with JIS K0070:1992.

The pressure-sensitive adhesive may contain any appropriate additive as required. Examples of the additive include a tackifying resin, a plasticizer, a pigment, a dye, a filler, an age resistor, a conductive material, an antistatic agent, a UV absorber, a light stabilizer, a release modifier, a softener, a surfactant, a flame retardant, an antioxidant, and a cross-linking agent. In order to appropriately control the strong adhesive property and peelability of the pressure-sensitive adhesive, it is particularly preferred that the pressure-sensitive adhesive contain a cross-linking agent, such as an epoxy-based cross-linking agent.

In one embodiment, the pressure-sensitive adhesive contains a tackifying resin. Particularly when the pressure-sensitive adhesive contains the styrene-based elastomer, it is preferred to use the elastomer and the tackifying resin in combination. When the tackifying resin is used in combination, a pressure-sensitive adhesive layer excellent in pressure-sensitive adhesive property can be formed.

Any appropriate tackifying resin is used as the tackifying resin as long as the effects of the present invention are obtained. Specific examples of the tackifying resin include a rosin-based tackifying resin (such as unmodified rosin, modified rosin, a rosin phenol-based resin, or a rosin ester-based resin), a terpene-based tackifying resin (such as a terpene-based resin, a terpene phenol-based resin, a styrene-modified terpene-based resin, an aromatic modified terpene-based resin, or a hydrogenated terpene-based resin), a hydrocarbon-based tackifying resin (such as an aliphatic hydrocarbon resin, an aliphatic cyclic hydrocarbon resin, an aromatic hydrocarbon resin (e.g., a styrene-based resin or a xylene-based resin), an aliphatic/aromatic petroleum resin, an aliphatic/alicyclic petroleum resin, a hydrogenated hydrocarbon resin, a coumarone-based resin, or a coumarone indene-based resin), a phenol-based tackifying resin (such as an alkylphenol-based resin, a xylene formaldehyde-based resin, resol, or novolac), a ketone-based tackifying resin, a polyamide-based tackifying resin, an epoxy-based tackifying resin, and an elastomer-based tackifying resin. Of those, a terpene-based tackifying resin, a rosin-based tackifying resin, or a hydrocarbon-based tackifying resin (preferably an aliphatic saturated hydrocarbon resin) is preferred. The tackifying resins may be used alone or in combination.

The content of the tackifying resin is preferably from 20 parts by weight to 350 parts by weight, more preferably from 10 parts by weight to 300 parts by weight with respect to 100 parts by weight of the base polymer. When the content falls within such ranges, a pressure-sensitive adhesive layer excellent in pressure-sensitive adhesive property can be formed. When the content of the tackifying resin is excessively high, the pressure-sensitive adhesive layer may become brittle.

In one embodiment, the pressure-sensitive adhesive contains a surfactant. When the pressure-sensitive adhesive containing the surfactant is used, a light-peel layer is formed in the pressure-sensitive adhesive layer through segregation of the surfactant by heating, and hence a pressure-sensitive adhesive sheet excellent in peelability can be obtained. The pressure-sensitive adhesive sheet of the present invention is configured to have a high pressure-sensitive adhesive property at 80° C., and hence a slight pressure-sensitive adhesive property remains even around the foaming starting temperature of the foaming agent in some cases. However, when the surfactant is added, a pressure-sensitive adhesive sheet remarkably excellent in peelability can be obtained.

Any appropriate surfactant may be used as the surfactant as long as the effects of the present invention are obtained. Examples of the surfactant include a nonionic surfactant, an anionic surfactant, a cationic surfactant, and a zwitterionic surfactant. Of those, a nonionic surfactant, an anionic surfactant, or a cationic surfactant is preferably used, and a nonionic surfactant or a cationic surfactant is more preferably used. The surfactants may be used alone or in combination thereof.

Examples of the nonionic surfactant include: a polyoxyethylene alkyl ether, such as a polyoxyethylene lauryl ether or a polyoxyethylene stearyl ether; a polyoxyethylene alkylphenyl ether, such as a polyoxyethylene octylphenyl ether or a polyoxyethylene nonylphenyl ether; a sorbitan fatty acid ester, such as sorbitan monolaulate, sorbitan monostearate, or polyoxyethylene sorbitan monolaulate; a polyoxyethylene glyceryl ether fatty acid ester; a polyoxyethylene-polyoxypropylene block copolymer; a saturated fatty acid ester, such as ethyl caprylate, ethyl caprate, methyl laurate, butyl laurate, methyl myristate, isopropyl myristate, methyl palmitate, isopropyl palmitate, methyl stearate, butyl stearate, methyl behenate, butyl laurate, butyl stearate, isopropyl myristate, or isopropyl palmitate; and a fatty acid amide, such as lauramide, palmitamide, stearamide, or behenamide.

In one embodiment, a phosphoric acid ester compound is used as the surfactant (nonionic surfactant). Examples of the phosphoric acid ester compound include: an alkyl phosphate, such as isopropyl phosphate or lauryl phosphate; a polyoxyalkylene alkyl ether phosphate; and salts thereof. Of those, a polyoxyalkylene alkyl ether phosphate is preferred.

When the phosphoric acid ester-based compound is a salt, as a counter ion for forming the salt, there are given, for example, cations, such as an alkali metal, ammonium, and organic ammonium. Examples of the alkali metal include sodium, potassium, and lithium. Examples of the organic ammonium include: an alkylamine, such as methylamine or ethylamine; and an alkanolamine, such as monoethanolamine, diethanolamine, or triethanolamine.

Examples of the polyoxyalkylene alkyl ether phosphate include polyoxyethylene capryl ether phosphate, polyoxyethylene decyl ether phosphate, polyoxyethylene lauryl ether phosphate, polyoxyethylene tridecyl ether phosphate, polyoxyethylene myristyl ether phosphate, polyoxyethylene pentadecyl ether phosphate, and polyoxyethylene stearyl ether phosphate. When the polyoxyalkylene alkyl ether phosphate is a salt, for example, sodium, potassium, barium, triethanolamine, or the like is preferably selected as a counter ion for forming the salt.

The number of moles added of ethylene oxides in the polyoxyalkylene alkyl ether phosphate is preferably from 1 to 20, more preferably from 1 to 10, still more preferably from 1 to 6, particularly preferably from 1 to 4, most preferably from 2 to 4.

Examples of the anionic surfactant include: an alkyl sulfate, such as lauryl sulfate or octadecyl sulfate; a fatty acid salt; an alkylbenzene sulfonate, such as nonylbenzene sulfonate or dodecylbenzene sulfonate; a naphthalene sulfonate, such as dodecylnaphthalene sulfonate; an alkyl diphenyl ether disulfonate, such as dodecyl diphenyl ether disulfonate; a polyoxyethylene alkyl ether sulfate, such as polyoxyethylene octadecyl ether sulfate or polyoxyethylene lauryl ether sulfate; a polyoxyethylene alkylphenyl ether sulfate, such as polyoxyethylene laurylphenyl ether sulfate; a polyoxyethylene styrenated phenyl ether sulfate; a sulfosuccinate, such as lauryl sulfosuccinate, polyoxyethylene lauryl sulfosuccinate, or dioctyl sulfosuccinate (dioctyl sodium sulfosuccinate); a polyoxyethylene alkyl ether phosphate; and a polyoxyethylene alkyl ether acetate. When the anionic surfactant forms a salt, the salt may be, for example, a metal salt (preferably a monovalent metal salt), such as a sodium salt, a potassium salt, a calcium salt, or a magnesium salt, or an ammonium salt or an amine salt.

Examples of the cationic surfactant include an alkyltrimethylammonium chloride, stearyltrimethylammonium chloride, lauryltrimethylammonium chloride, cetyltrimethylammonium chloride, a beef tallow alkyltrimethylammonium chloride, behenyltrimethylammonium chloride, stearyltrimethylammonium bromide, behenyltrimethylammonium bromide, distearyldimethylammonium chloride, dicocoyldimethylammonium chloride, dioctyldimethylammonium chloride, di(POE)oleylmethylammonium(2EO) chloride, benzalkonium chloride, an alkylbenzalkonium chloride, an alkyldimethylbenzalkonium chloride, benzethonium chloride, stearyldimethylbenzylammonium chloride, a lanolin-derived quaternary ammonium salt, diethylaminoethylamide stearate, dimethylaminopropylamide stearate, behenic acid amidepropyldimethylhydroxypropylammonium chloride, stearoyl colaminoformyl methylpyridinium chloride, cetylpyridinium chloride, a tall oil alkylbenzyl hydroxyethylimidazolinium chloride, and a benzylammonium salt.

A commercially available product may be used as the surfactant. Examples of the commercially available surfactant include: phosphoric acid ester-based surfactants, such as a product manufactured under the product name "PHOSPHANOL RL210" by Toho Chemical Industry Co., Ltd.; fatty acid ester-based surfactants, such as a product manufactured under the product name "EXCEPARL IPP" by Kao Corporation and methyl palmitate manufactured by Tokyo Chemical Industry Co., Ltd.; fatty acid amide-based surfactants, such as stearamide and lauramide manufactured by Tokyo Chemical Industry Co., Ltd.; fatty acid aminoalkylamide-based surfactants, such as a product manufactured under the product name "CATINAL MAPS" by Toho Chemical Industry Co., Ltd.; trimethylammonium chloride-based surfactants, such as a product manufactured under the product name "CATINAL STC-70ET" by Toho Chemical Industry Co., Ltd.; dimethylbenzylammonium chloride-based surfactants, such as a product manufactured under the product name "CATION S" by Sanyo Chemical Industries, Ltd.; succinic anhydride-based surfactants, such as products manufactured under the product names "DSA" and "PDSA-DA" by Sanyo Chemical Industries, Ltd.; and sodium sulfosuccinate-based surfactants, such as a product manufactured under the product name "SANSEPARER 100" by Sanyo Chemical Industries, Ltd.

In one embodiment, the surfactant has an alkyl group as a hydrophobic group. It is preferred to use a surfactant having a linear or branched (preferably linear) alkyl group having 5 to 20 (more preferably 8 to 18, still more preferably 10 to 18) carbon atoms. When such surfactant is used, there can be obtained a pressure-sensitive adhesive sheet capable of exhibiting excellent peelability under high temperature without the impairment of its pressure-sensitive adhesive property at ordinary temperature.

The content of the surfactant is preferably from 0.001 part by weight to 15 parts by weight, more preferably from 0.01 part by weight to 10 parts by weight, still more preferably from 0.1 part by weight to 8 parts by weight, particularly preferably from 1 part by weight to 5 parts by weight with respect to 100 parts by weight of the base polymer. When the content falls within such ranges, there can be obtained a pressure-sensitive adhesive sheet capable of exhibiting excellent peelability even under high temperature.

The molecular weight of the surfactant is preferably 800 or less, more preferably 600 or less, still more preferably 500 or less. The lower limit of the molecular weight of the surfactant is, for example, 150. When the molecular weight falls within such ranges, there can be obtained a pressure-sensitive adhesive sheet capable of exhibiting excellent peelability even under high temperature.

In one embodiment, the pressure-sensitive adhesive contains a cross-linking agent. When the pressure-sensitive adhesive contains the cross-linking agent, the cohesive strength of the pressure-sensitive adhesive layer can be adjusted, and hence there can be obtained a pressure-sensitive adhesive sheet excellent in peelability under high temperature while having an excellent adhesive property under ordinary temperature.

Any appropriate cross-linking agent may be used as the cross-linking agent as long as the effects of the present invention are obtained. Examples of the cross-linking agent include an epoxy-based cross-linking agent, an isocyanate-based cross-linking agent, a melamine-based cross-linking agent, a peroxide-based cross-linking agent, a urea-based cross-linking agent, a metal alkoxide-based cross-linking agent, a metal chelate-based cross-linking agent, a metal salt-based cross-linking agent, a carbodiimide-based cross-linking agent, an oxazoline-based cross-linking agent, an aziridine-based cross-linking agent, and an amine-based cross-linking agent. Of those, an epoxy-based cross-linking agent is preferred.

Examples of the epoxy-based cross-linking agent include N,N,N',N'-tetraglycidyl-m-xylenediamine, diglycidylaniline, 1,3-bis(N,N-glycidylaminomethyl)cyclohexane (manufactured by Mitsubishi Gas Chemical Company, Inc., product name: "TETRAD-C"), 1,6-hexanediol diglycidyl ether (manufactured by Kyoeisha Chemical Co., Ltd., product name: "Epolite 1600"), neopentyl glycol diglycidyl ether (manufactured by Kyoeisha Chemical Co., Ltd., product name: "Epolite 1500NP"), ethylene glycol diglycidyl ether (manufactured by Kyoeisha Chemical Co., Ltd., product name: "Epolite 40E"), propylene glycol diglycidyl ether (manufactured by Kyoeisha Chemical Co., Ltd., product name: "Epolite 70P"), polyethylene glycol diglycidyl ether (manufactured by NOF Corporation, product name: "EPIOL E-400"), polypropylene glycol diglycidyl ether (manufactured by NOF Corporation, product name: "EPIOL P-200"), sorbitol polyglycidyl ether (manufactured by Nagase ChemteX Corporation, product name: "Denacol EX-611"), glycerol polyglycidyl ether (manufactured by Nagase ChemteX Corporation, product name: "Denacol EX-314"), pentaerythritol polyglycidyl ether, polyglycerol polyglycidyl ether (manufactured by Nagase ChemteX Corporation, product name: "Denacol EX-512"), sorbitan polyglycidyl ether, trimethylolpropane polyglycidyl ether, adipic acid diglycidyl ester, o-phthalic acid diglycidyl ester, triglycidyl-tris (2-hydroxyethyl) isocyanurate, resorcin diglycidyl ether, bisphenol-S-diglycidyl ether, and an epoxy-based resin having two or more epoxy groups in a molecule thereof. The content of the epoxy-based cross-linking agent may be set to any appropriate amount depending on, for example, desired pressure-sensitive adhesive strength of the pressure-sensitive adhesive sheet and desired elasticity of the pressure-sensitive adhesive layer, and is typically from 0.01 part by weight to 10 parts by weight, preferably from 0.03 part by weight to 5 parts by weight with respect to 100 parts by weight of the base polymer.

B-2. Foaming Agent

The pressure-sensitive adhesive layer further contains a foaming agent. The foaming agent is an additive that can foam through heating. Any appropriate foaming agent is used as the foaming agent as long as the effects of the present invention are obtained. Thermally expandable microspheres may be typically used as the foaming agent. When a pressure-sensitive adhesive sheet including a pressure-sensitive adhesive layer containing the thermally expandable microspheres is heated, the thermally expandable microspheres expand or foam to cause unevenness on its pressure-sensitive adhesive surface, with the result that its pressure-sensitive adhesive strength is decreased or lost. Such pressure-sensitive adhesive sheet can be easily peeled off through heating.

The foaming starting temperature of the foaming agent is 90° C. or more, preferably from 90° C. to 260° C., more preferably from 100° C. to 220° C. When a foaming agent (preferably thermally expandable microspheres) having a foaming starting temperature within such ranges is used, there can be obtained a pressure-sensitive adhesive sheet that, in the backgrinding of a hard and brittle substrate (e.g., a sapphire wafer), has an excellent pressure-sensitive adhesive property during the backgrinding, and can express excellent peelability through heating after the backgrinding. Herein, the foaming starting temperature corresponds to, for example, the lowest temperature at which the pressure-sensitive adhesive strength of the pressure-sensitive adhesive layer becomes 10% or less with respect to the ordinary-state pressure-sensitive adhesive strength (pressure-sensitive adhesive strength for a PET film at 23° C.) of the pressure-sensitive adhesive layer. The term "pressure-sensitive adhesive strength" as used in this case refers to a pressure-sensitive adhesive strength measured by a method in conformity with JIS Z 0237:2000 (bonding conditions: one pass back and forth with a 2 kg roller, peel rate: 300 mm/min, peel angle: 180°). In addition, the pressure-sensitive adhesive strength at the foaming starting temperature (and of a measurement sample after heating) is measured after the measurement sample has been returned to ordinary temperature (23° C.). When the foaming agent is thermally expandable microspheres, a temperature at which the thermally expandable microspheres start to expand corresponds to the foaming starting temperature.

Any appropriate thermally expandable microspheres may be used as the thermally expandable microspheres as long as the microspheres are capable of foaming at the foaming starting temperature. For example, microspheres each obtained by encapsulating a substance which easily expands through heating in a shell having elasticity may be used as the thermally expandable microspheres. Such thermally expandable microspheres may be manufactured by any appropriate method, such as a coacervation method or an interfacial polymerization method.

Examples of the substance which easily expands through heating include: a low-boiling point liquid, such as propane, propylene, butene, n-butane, isobutane, isopentane, neopentane, n-pentane, n-hexane, isohexane, heptane, octane, petroleum ether, a halomethane, or a tetraalkylsilane; and azodicarbonamide, which is gasified by thermal decomposition.

An example of the constituent substance for the shell is a polymer constituted of: a nitrile monomer, such as acrylonitrile, methacrylonitrile, α-chloroacrylonitrile, α-ethoxyacrylonitrile, or fumaronitrile; a carboxylic acid monomer, such as acrylic acid, methacrylic acid, itaconic acid, maleic acid, fumaric acid, or citraconic acid; vinylidene chloride; vinyl acetate; a (meth)acrylic acid ester, such as methyl (meth)acrylate, ethyl (meth)acrylate, n-butyl (meth)acrylate, isobutyl (meth)acrylate, t-butyl (meth)acrylate, isobornyl (meth)acrylate, cyclohexyl (meth)acrylate, benzyl (meth)acrylate, or β-carboxyethyl acrylate; a styrene monomer, such as styrene, α-methylstyrene, or chlorostyrene; or an amide monomer, such as acrylamide, a substituted acrylamide, methacrylamide, or a substituted methacrylamide. The polymer constituted of such monomer may be a homopolymer, or may be a copolymer. Examples of the copolymer include a vinylidene chloride-methyl methacrylate-acrylonitrile copolymer, a methyl methacrylate-acrylonitrile-methacrylonitrile copolymer, a methyl methacrylate-acrylonitrile copolymer, and an acrylonitrile-methacrylonitrile-itaconic acid copolymer.

Commercially available thermally expandable microspheres may be used as the thermally expandable microspheres. Specific examples of the commercially available thermally expandable microspheres include: products manufactured under the product name "Matsumoto Microsphere" (grade: F-30, F-30D, F-36D, F-36LV, F-50, F-50D, F-65, F-65D, FN-100SS, FN-100SSD, FN-180SS, FN-180SSD, F-190D, F-260D, and F-2800D) by Matsumoto Yushi-Seiyaku Co., Ltd.; products manufactured under the product name "Expancel" (grade: 053-40, 031-40, 920-40, 909-80, and 930-120) by Japan Fillite Co., Ltd.; products manufactured under the product name "DAIFOAM" (grade: H750, H850, H1100, S2320D, S2640D, M330, M430, and M520) by Kureha Chemical Industry Co., Ltd.; and products manufactured under the product name "ADVANCELL" (grade: EML101, EMH204, EHM301, EHM302, EHM303, EM304, EHM401, EM403, and EM501) by Sekisui Chemical Co., Ltd.

Under an ambient temperature of 25° C., the average particle diameter of the thermally expandable microspheres before the foaming of the thermally expandable microspheres is preferably 50 μm or less, more preferably from 1 μm to 50 μm, still more preferably from 3 μm to 35 μm, particularly preferably from 5 μm to 35 μm. When thermally expandable microspheres having an average particle diameter of 50 μm or less are used, before the foaming of the thermally expandable microspheres (i.e., in a situation in which the pressure-sensitive adhesive layer needs to have a pressure-sensitive adhesive property), the thermally expandable microspheres hardly affect the pressure-sensitive adhesive layer surface, and hence there can be obtained a pressure-sensitive adhesive sheet having an excellent pressure-sensitive adhesive property with high adhesiveness to an adherend. The average particle diameter of the thermally expandable microspheres is preferably as large as possible within the above-mentioned ranges because the thermally expandable microspheres expand more when heated. When thermally expandable microspheres having an average particle diameter within the above-mentioned ranges are used, a pressure-sensitive adhesive sheet excellent in peelability can be obtained. The average particle diameter of the thermally expandable microspheres may be controlled on the basis of, for example, conditions for the polymerization of the thermally expandable microspheres (e.g., the rotation speed of a stirring blade during the polymerization, and a polymerization temperature). In addition, when commercially available thermally expandable microspheres are used, the average particle diameter may be controlled by classification treatment, such as mesh treatment, filter treatment, or centrifugal treatment. Herein, the average particle diameter may be measured by observing the thermally expandable microspheres to be used, or thermally expandable microspheres removed from the pressure-sensitive adhesive layer before heating, through use of an optical microscope or an electron microscope. In addition, the average particle diameter may be measured by a particle size distribution measurement method in a laser scattering method. More specifically, the average particle diameter may be measured using a particle size distribution measurement apparatus (e.g., a product manufactured under the product name "SALD-2000J" by Shimadzu Corporation) after the thermally expandable microspheres to be used have been dispersed in a predetermined solvent (e.g., water).

It is preferred that the thermally expandable microspheres each have such a moderate strength that rupture does not occur until a volume expansion ratio reaches preferably 5 times or more, more preferably 7 times or more, still more preferably 10 times or more. When such thermally expandable microspheres are used, the pressure-sensitive adhesive strength can be efficiently lowered through heat treatment.

The content of the thermally expandable microspheres in the pressure-sensitive adhesive layer may be appropriately set depending on, for example, a desired decreasing property of the pressure-sensitive adhesive strength. The content of the thermally expandable microspheres is preferably from 20 parts by weight to 210 parts by weight, more preferably from 30 parts by weight to 200 parts by weight, still more preferably from 50 parts by weight to 150 parts by weight with respect to 100 parts by weight of the base polymer. When the content falls within such ranges, there can be obtained a pressure-sensitive adhesive sheet that shows a satisfactory adhesive property during backgrinding, and that allows an adherend to be easily peeled therefrom when heated.

The content ratio of the thermally expandable microspheres in the pressure-sensitive adhesive layer is preferably from 5 wt % to 80 wt %, more preferably from 10 wt % to 70 wt %, still more preferably from 15 wt % to 65 wt % with respect to the weight of the pressure-sensitive adhesive layer. The content ratio of the thermally expandable microspheres may be calculated from the volume filling ratio (volume filling ratio at a temperature equal to or lower than the foaming starting temperature (e.g., at 23° C.)) of the thermally expandable microspheres obtained by X-ray CT analysis, SEM analysis, or the like, the specific gravity of the thermally expandable microspheres, and the specific gravity of a region other than the thermally expandable microspheres. In one embodiment, the calculation may be performed on the basis of a rough estimate that the specific gravity of the thermally expandable microspheres is 1 and the specific gravity of the region other than the thermally expandable microspheres is 1, and the content ratio of the thermally expandable microspheres in this case falls within the above-mentioned ranges.

The content ratio of the thermally expandable microspheres in the pressure-sensitive adhesive layer is preferably from 5 vol % to 80 vol %, more preferably from 10 vol % to 70 vol %, still more preferably from 15 vol % to 65 vol % with respect to the volume of the pressure-sensitive adhesive layer. The volume-based content ratio corresponds to the volume filling ratio, and as described above, may be measured by X-ray CT analysis, SEM analysis, or the like. More specifically, the volume filling ratio may be measured by the following method.

<Volume Filling Ratio Measurement Method>
  i) The pressure-sensitive adhesive sheet before heating in a state in which the pressure-sensitive adhesive layer thereof is directed upward is used as a sample and fixed to a holder, and 1,601 successive transmission images thereof are taken by X-ray CT at from 0° to 180°. In the X-ray CT, measurement is performed with ZEISS, Xradia 520 Versa at a tube voltage of 40 kV, a tube current of 73 µA, and a pixel size of 0.3 µm/pixel.
  ii) Reconstruction is performed on the basis of the resultant full transmission images to create tomographic images, and a three-dimensional reconstructed image (TIF stack image) and a reconstructed cross-sectional image (three-sided view) are created using analytical software ImageJ.
  iii) The resultant three-dimensional reconstructed image (TIF stack image) is subjected to image processing to identify the thermally expandable microspheres. On the basis of the results of the identification, a volume filling ratio in a thickness direction, the volumes of individual foams, and the sphere-equivalent diameters thereof are calculated.

The thickness of the pressure-sensitive adhesive layer of each sample is measured by SEM cross-sectional observation, and the filling ratio is calculated using a value excluding cell portions as a total volume.

An inorganic foaming agent or an organic foaming agent may be used as the foaming agent. Examples of the inorganic foaming agent include ammonium carbonate, ammonium hydrogen carbonate, sodium hydrogen carbonate, ammonium nitrite, sodium boron hydroxide, and various azides. In addition, examples of the organic foaming agent include: a chlorofluoroalkane-based compound, such as trichloromonofluoromethane or dichloromonofluoromethane; an azo-based compound, such as azobisisobutyronitrile, azodicarbonamide, or barium azodicarboxylate; a hydrazine-based compound, such as p-toluenesulfonylhydrazide, diphenyl sulfone-3,3'-disulfonylhydrazide, 4,4'-oxybis(benzenesulfonylhydrazide), or allylbis(sulfonylhydrazide); a semicarbazide-based compound, such as p-toluylenesulfonylsemicarbazide or 4,4'-oxybis(benzenesulfonylsemicarbazide); a triazole-based compound, such as 5-morpholyl-1,2,3,4-thiatriazole; and an N-nitroso-based compound, such as N,N'-dinitrosopentamethylenetetramine or N,N'-dimethyl-N,N'-dinitrosoterephthalamide.

C. Base Material

Examples of the base material include a resin sheet, a nonwoven fabric, paper, metal foil, a woven fabric, a rubber sheet, a foamed sheet, and laminates thereof (particularly a laminate containing a resin sheet). As a resin for forming the resin sheet, there are given, for example, polyethylene terephthalate (PET), polyethylene naphthalate (PEN), polybutylene terephthalate (PBT), polyethylene (PE), polypropylene (PP), an ethylene-propylene copolymer, an ethylene-vinyl acetate copolymer (EVA), polyamide (nylon), wholly aromatic polyamide (aramid), polyimide (PI), polyvinyl chloride (PVC), polyphenylene sulfide (PPS), a fluorine-based resin, and polyether ether ketone (PEEK). Examples of the non-woven fabric include: non-woven fabrics of natural fibers each having heat resistance, such as a non-woven fabric containing Manila hemp; and non-woven fabrics of synthetic resins, such as a non-woven fabric of a polypropylene resin, a non-woven fabric of a polyethylene resin, and a non-woven fabric of an ester-based resin. Examples of the metal foil include copper foil, stainless-steel foil, and aluminum foil. Examples of the paper include Japanese paper and kraft paper. The base material may be a single layer or a multilayer. When the base material is a multilayer, the configurations of its layers may be identical to or different from each other.

The thickness of the base material may be set to any appropriate thickness depending on, for example, desired strength or flexibility, and intended use. The thickness of the base material is preferably 1,000 µm or less, more preferably from 1 µm to 1,000 µm, still more preferably from 1 µm to 500 µm, particularly preferably from 3 µm to 300 µm, most preferably from 5 µm to 250 µm.

The base material may be subjected to surface treatment. Examples of the surface treatment include corona treatment, chromic acid treatment, ozone exposure, flame exposure, high-voltage electric shock exposure, ionizing radiation treatment, and coating treatment with an undercoating agent.

Examples of the organic coating material include materials described in "Plastic Hard Coat Material II (CMC Publishing Co., Ltd., (2004))." A urethane-based polymer is preferably used, and polyurethane acrylate, polyester polyurethane, or a precursor thereof is more preferably used. This is because of the following reasons: any such material can be easily coated and applied onto the base material; and many kinds of the material can be industrially selected and are each available at low cost. The urethane-based polymer is, for example, a polymer formed of a reacted mixture of an isocyanate monomer and an alcoholic hydroxy group-containing monomer (e.g., a hydroxy group-containing acrylic compound or a hydroxy group-containing ester compound). The organic coating material may contain, as an optional additive, a chain extender, such as polyamine, an age resistor, an oxidation stabilizer, or the like. The thickness of an organic coating layer is not particularly limited, but is suitably, for example, from about 0.1 µm to about 10 µm, preferably from about 0.1 µm to about 5 µm, more preferably from about 0.5 µm to about 5 µm.

D. Other Pressure-Sensitive Adhesive Layer

Any appropriate pressure-sensitive adhesive layer may be formed as the other pressure-sensitive adhesive layer. As a pressure-sensitive adhesive for forming the other pressure-sensitive adhesive layer, there are given, for example, a rubber-based pressure-sensitive adhesive, an acrylic pressure-sensitive adhesive, a vinyl alkyl ether-based pressure-sensitive adhesive, a silicone-based pressure-sensitive adhesive, a polyester-based pressure-sensitive adhesive, a polyamide-based pressure-sensitive adhesive, a urethane-based pressure-sensitive adhesive, a fluorine-based pressure-sensitive adhesive, and a styrene-diene block copolymer-based pressure-sensitive adhesive. The pressure-sensitive adhesive may have blended therein, for example, a known or commonly used additive, such as a plasticizer, a filler, a surfactant, an age resistor, or a tackifier.

The thickness of the other pressure-sensitive adhesive layer is preferably 300 µm or less, more preferably from 1 µm to 300 µm, still more preferably from 5 µm to 100 µm.

E. Elastic Layer

The pressure-sensitive adhesive sheet of the present invention may further include an elastic layer. The elastic layer may be arranged on one surface of the pressure-sensitive adhesive layer. When the pressure-sensitive adhesive sheet includes the base material, the elastic layer may be arranged between the pressure-sensitive adhesive layer and the base material. When the pressure-sensitive adhesive sheet includes the elastic layer, its followability to an adherend is improved. In addition, when the pressure-sensitive adhesive sheet including the elastic layer is heated at the time of peeling, the deformation (expansion) of the pressure-sensitive adhesive layer in its plane direction is restricted, and the deformation thereof in its thickness direction is dominant. As a result, peelability is improved.

The elastic layer contains a base polymer, and as the base polymer, the polymers given as examples of the base polymer for forming the pressure-sensitive adhesive layer may each be used. In one embodiment, the elastic layer may contain a natural rubber, a synthetic rubber, a synthetic resin, or the like. Examples of the synthetic rubber and the synthetic resin include: a nitrile-based, diene-based, or acrylic synthetic rubber; a polyolefin-based or polyester-based thermoplastic elastomer; an ethylene-vinyl acetate copolymer; polyurethane; polybutadiene; and a soft polyvinyl chloride. The base polymer for forming the elastic layer may be identical to or different from the base polymer for forming the pressure-sensitive adhesive layer. The elastic layer may be a foamed film formed from the base polymer. The foamed film may be obtained by any appropriate method. The elastic layer and the pressure-sensitive adhesive layer may be distinguished from each other on the basis of a difference between their base polymers and/or the presence or absence of the foaming agent (the elastic layer contains no foaming agent). More specifically, in the case where an interface between the elastic layer and the pressure-sensitive adhesive layer can be recognized by cross-sectional observation, such as the case where the elastic layer and the pressure-sensitive adhesive layer are formed from different base polymers, a boundary between the elastic layer and the pressure-sensitive adhesive layer is defined by the interface. In addition, in the case where the interface between the elastic layer and the pressure-sensitive adhesive layer cannot be recognized by cross-sectional observation, a region in which the foaming agent is observed by cross-sectional observation is the pressure-sensitive adhesive layer.

The elastic layer may contain any appropriate additive as required. Examples of the additive include a cross-linking agent, a vulcanizing agent, a tackifying resin, a plasticizer, a softener, a filler, and an age resistor. When a hard resin, such as polyvinyl chloride, is used as the base polymer, it is preferred that the plasticizer and/or the softener be used therewith to form an elastic layer having desired elasticity.

The thickness of the elastic layer is preferably from 3 µm to 200 µm, more preferably from 5 µm to 100 µm. When the thickness falls within such ranges, the above-mentioned function of the elastic layer can be sufficiently exhibited.

The tensile modulus of elasticity of the elastic layer at 25° C. is preferably from 0.2 MPa to 500 MPa, more preferably from 0.3 MPa to 500 MPa, still more preferably from 0.5 MPa to 500 MPa. When the tensile modulus of elasticity falls within such ranges, the above-mentioned function of the elastic layer can be sufficiently exhibited. The tensile modulus of elasticity may be measured in conformity with JIS K 7161:2008.

F. Separator

The pressure-sensitive adhesive sheet of the present invention may further include a separator as required. At least one surface of the separator is a release surface, and the separator may be arranged in order to protect the pressure-sensitive adhesive layer. The separator may be formed from any appropriate material.

G. Method of Manufacturing Pressure-Sensitive Adhesive Sheet

The pressure-sensitive adhesive sheet of the present invention may be manufactured by any appropriate method. Examples of the method of manufacturing the pressure-sensitive adhesive sheet of the present invention include: a method involving directly applying a composition containing the pressure-sensitive adhesive and the foaming agent onto the base material (any appropriate base when a pressure-sensitive adhesive sheet that does not include the base material is to be obtained); or a method involving transferring, onto the base material, an applied layer formed by applying a composition containing the pressure-sensitive adhesive and the foaming agent onto any appropriate base. The composition containing the pressure-sensitive adhesive and the foaming agent may contain any appropriate solvent. In addition, the pressure-sensitive adhesive layer containing the foaming agent may be formed by: forming a pressure-sensitive adhesive applied layer using a composition containing the pressure-sensitive adhesive; then sprinkling the foaming agent (thermally expandable microspheres) over the pressure-sensitive adhesive applied layer; and then burying the foaming agent into the applied layer using a laminator or the like.

When the pressure-sensitive adhesive sheet includes the elastic layer, the elastic layer may be formed by, for example, applying a composition for forming the elastic layer onto the base material or the pressure-sensitive adhesive layer.

Any appropriate application method may be adopted as an application method for each of the above-mentioned compositions. For example, each layer may be formed by application, followed by drying. Examples of the application method include application methods each using a multicoater, a die coater, a gravure coater, an applicator, or the like. As a drying method, there are given, for example, natural drying and drying by heating. When the drying by heating is performed, a heating temperature may be set to any appropriate temperature depending on the characteristics of a substance to be dried.

EXAMPLES

Now, the present invention is specifically described by way of Examples. However, the present invention is by no means limited to these Examples. Evaluation methods in Examples are as described below. In the following evaluations, a pressure-sensitive adhesive sheet obtained by peeling a separator was used. In addition, the terms "part(s)" and "%" in Examples are by weight unless otherwise stated.

<Evaluation Methods>

In the following evaluation methods, the bonding of a pressure-sensitive adhesive layer (and another pressure-sensitive adhesive layer) was performed after a separator laminated on the bonding surface thereof had been peeled therefrom.

(1) Shear Adhesive Strength

A pressure-sensitive adhesive sheet (size: 20 mm×20 mm) obtained in each of Examples and Comparative Examples was fixed by bonding the surface thereof on the opposite side to the pressure-sensitive adhesive layer thereof to a predetermined base (e.g., 20 mm×20 mm silicon chip). A 5 mm×5 mm silicon chip was placed on the pressure-sensitive adhesive layer surface of the pressure-sensitive adhesive sheet, and the silicon chip was subjected to thermocompression bonding under the bonding conditions of 100° C. and 0.1 MPa for 1 minute with a heat pressing machine to produce an evaluation sample. A double-sided tape No. 585 manufactured by Nitto Denko Corporation was used to fix a pressure-sensitive adhesive sheet that did not include another pressure-sensitive adhesive layer to the base.

With use of the evaluation sample, under an ambient temperature of 25° C., Dage 4000 manufactured by Nordson Corporation was used to apply an external force in a horizontal direction to the chip at a shear rate of 500 μm/sec. with a measuring terminal being set on the side surface of the 5 mm×5 mm silicon chip at a position at a height of 50 μm from the bonded surface, and the maximum breaking load was read from the thus obtained load-displacement curve and was adopted as a shear adhesive strength under an ambient temperature of 25° C. In addition, under an ambient temperature of 80° C., a shear adhesive strength was measured in the same manner as described above.

Table 1 shows values each of which is an average of three measurements.

(2) Microhardness

A Berkovich (triangular pyramid-shaped) probe made of diamond was perpendicularly pressed against the pressure-sensitive adhesive layer surface (at a site where a foaming agent was not present) of the pressure-sensitive adhesive sheet obtained in each of Examples and Comparative Examples, and the thus obtained displacement-load hysteresis curve was subjected to numerical processing with software (TriboScan) included with a measurement apparatus, to thereby measure a microhardness H. The microhardness H was measured with a nanoindenter (Triboindenter TI-950 manufactured by Hysitron, Inc.) by a single indentation method at 25° C. under the measurement conditions of an indentation speed of about 500 nm/sec and an indentation depth of about 3,000 nm.

(3) Sapphire Grindability

A sapphire wafer having a thickness of 900 μm and a size of 4 inches was placed on the pressure-sensitive adhesive layer of the pressure-sensitive adhesive sheet obtained in each of Examples and Comparative Examples, and then the sapphire wafer and the pressure-sensitive adhesive sheet were compression-bonded to each other with a heat pressing machine, which had been preheated to 90° C. in advance, at a pressure of 1.0 MPa for 5 minutes. The pressure-sensitive adhesive sheet having the sapphire wafer fixed thereto was set in a grinder apparatus DFG8540 manufactured by DISCO Corporation, and the sapphire wafer was ground until the wafer thickness became 120 μm. Grindability was evaluated on the basis of the following criteria.

o: Back surface grinding can be performed until the wafer thickness becomes 120 μm.

x: The wafer is broken or an edge of the wafer is chipped before the wafer thickness becomes 120 μm. (Back surface grinding cannot be performed.)

(4) Peelability

The pressure-sensitive adhesive sheet obtained in each of Examples and Comparative Examples was cut to measure 30 mm×30 mm, and the pressure-sensitive adhesive layer surface thereof was bonded to a glass plate having a size of 30 mm×30 mm. After that, a glass plate having a size of 30 mm×30 mm was also placed on the surface thereof on the opposite side to the pressure-sensitive adhesive layer, followed by compression bonding at a pressure of 0.3 MPa for 1 minute with a heat pressing machine, which had been preheated to 90° C. in advance, to produce a sample. The produced sample was placed on a hot plate, which had been preheated in advance to a temperature higher by 30° C. than the foaming starting temperature of thermally expandable microspheres contained in the pressure-sensitive adhesive layer, and was heated for 5 minutes, and heat peelability at this time was determined. The peelability was evaluated on the basis of the following criteria. For a pressure-sensitive adhesive sheet that did not include another pressure-sensitive adhesive layer, a double-sided tape No. 585 manufactured by Nitto Denko Corporation was used to fix the surface on the opposite side to the pressure-sensitive adhesive layer to the glass plate.

o: The glass plate on the pressure-sensitive adhesive layer side can be separated after heating.

x: The glass plate on the pressure-sensitive adhesive layer side cannot be separated even after heating.

Example 1

100 Parts by weight of a maleic acid-modified styrene-ethylene-butylene-styrene block copolymer (a) (SEBS: styrene moiety/ethylene-butylene moiety (weight ratio)=30/70, acid value: 10 (mg-$CH_3$ONa/g), manufactured by Asahi Kasei Chemicals Corporation, product name: "Tuftec M1913"), 25 parts by weight of a terpene phenol-based tackifying resin (manufactured by Yasuhara Chemical Co., Ltd., product name: "YS POLYSTER T80"), 3 parts by weight of an epoxy-based cross-linking agent (manufactured by Mitsubishi Gas Chemical Company, Inc., product name: "TETRAD-C"), 30 parts by weight of thermally expandable microspheres (manufactured by Matsumoto Yushi-Seiyaku Co., Ltd., product name: "Matsumoto Microsphere F-50D", foaming starting temperature: 120° C., average particle diameter: 14 μm), 3 parts by weight of a phosphoric acid ester-based surfactant (manufactured by Toho Chemical Industry Co., Ltd., product name: "PHOSPHANOL RL210", molecular weight: 422.57, chemical formula: $C_{22}H_{47}O_5P$, carbon number of alkyl group: 18), and toluene serving as a solvent were mixed to prepare a resin composition (I) (mixture). The resin composition (I) was applied onto a separator so as to have a thickness of 40 μm after drying, and was dried to form a pressure-sensitive adhesive layer. Further, the pressure-sensitive adhesive layer on the separator was bonded to another separator to produce a pressure-sensitive adhesive sheet having the layer configuration "separator/pressure-sensitive adhesive layer/separator". The resultant pressure-sensitive adhesive sheet was subjected to the evaluations (1) to (4). The results are shown in Table 1.

Examples 2 to 5

Pressure-sensitive adhesive sheets were obtained in the same manner as in Example 1 except that the addition amounts of the tackifying resin and the thermally expandable microspheres were changed to amounts shown in Table 1. The resultant pressure-sensitive adhesive sheets were subjected to the evaluations (1) to (4). The results are shown in Table 1.

Example 6

A pressure-sensitive adhesive sheet was obtained in the same manner as in Example 1 except that: a maleic acid-modified styrene-ethylene-butylene-styrene block copolymer (b) containing a styrene moiety/an ethylene-butylene moiety (weight ratio) at 20/80 (acid value: 10 (mg-CH$_3$ONa/g), manufactured by Asahi Kasei Chemicals Corporation, product name: "Tuftec M1943") was used in place of the maleic acid-modified styrene-ethylene-butylene-styrene block copolymer (a); and the addition amounts of the tackifying resin and the thermally expandable microspheres were changed to amounts shown in Table 1. The resultant pressure-sensitive adhesive sheet was subjected to the evaluations (1) to (4). The results are shown in Table 1.

Example 7

A pressure-sensitive adhesive sheet was obtained in the same manner as in Example 1 except that: a styrene-ethylene-butylene-styrene block copolymer (c) containing a styrene moiety/an ethylene-butylene moiety (weight ratio) at 70/30 (unmodified product, manufactured by Asahi Kasei Chemicals Corporation, product name: "Tuftec H1043") was used in place of the maleic acid-modified styrene-ethylene-butylene-styrene block copolymer (a); and the addition amounts of the tackifying resin and the thermally expandable microspheres were changed to amounts shown in Table 1. The resultant pressure-sensitive adhesive sheet was subjected to the evaluations (1) to (4). The results are shown in Table 1.

Example 8

100 Parts by weight of a maleic acid-modified styrene-ethylene-butylene-styrene block copolymer (a) (SEBS: styrene moiety/ethylene-butylene moiety (weight ratio)=30/70, acid value: 10 (mg-CH$_3$ONa/g), manufactured by Asahi Kasei Chemicals Corporation, product name: "Tuftec M1913"), 50 parts by weight of a terpene phenol-based tackifying resin (manufactured by Yasuhara Chemical Co., Ltd., product name: "YS POLYSTER T80"), 3 parts by weight of an epoxy-based cross-linking agent (manufactured by Mitsubishi Gas Chemical Company, Inc., product name: "TETRAD-C"), 50 parts by weight of thermally expandable microspheres (manufactured by Matsumoto Yushi-Seiyaku Co., Ltd., product name: "Matsumoto Microsphere F-50D", foaming starting temperature: 120° C., average particle diameter: 14 μm), 3 parts by weight of a phosphoric acid ester-based surfactant (manufactured by Toho Chemical Industry Co., Ltd., product name: "PHOSPHANOL RL210", molecular weight: 422.57, carbon number of alkyl group: 18), and toluene serving as a solvent were mixed to prepare a resin composition (II) (mixture).

The resin composition (II) was applied to one surface of a PET base material (thickness: 50 μm) so as to have a thickness of 40 μm after drying, and was dried to form a pressure-sensitive adhesive layer. Further, a separator was bonded onto the pressure-sensitive adhesive layer.

Then, 100 parts by weight of an acrylic resin (butyl acrylate-acrylic acid copolymer, butyl acrylate:acrylic acid (weight ratio)=100:5), 1 part by weight of a urethane-based cross-linking agent (manufactured by Nippon Polyurethane Industry Co., Ltd., product name: "Coronate L"), and toluene serving as a solvent were mixed to prepare a resin composition (A). The resin composition (A) was applied to the other surface of the PET base material so as to have a thickness of 10 μm after drying, and was dried to form another pressure-sensitive adhesive layer. Further, a separator was bonded onto the other pressure-sensitive adhesive layer.

Thus, a pressure-sensitive adhesive sheet having the layer configuration "separator/pressure-sensitive adhesive layer/base material/other pressure-sensitive adhesive layer/separator" was obtained. The resultant pressure-sensitive adhesive sheet was subjected to the evaluations (1) to (4). The results are shown in Table 1.

Example 9

The resin composition (II) prepared in Example 8 was applied to one surface of a PET base material (thickness: 50 μm) so as to have a thickness of 40 μm after drying, and was dried to form a pressure-sensitive adhesive layer. Further, a separator was bonded onto the pressure-sensitive adhesive layer. Then, the resin composition (II) prepared in Example 8 was also applied to the other surface of the base material so as to have a thickness of 40 μm after drying, and was dried to form a pressure-sensitive adhesive layer. Further, a separator was bonded onto the pressure-sensitive adhesive layer.

Thus, a pressure-sensitive adhesive sheet having the layer configuration "separator/pressure-sensitive adhesive layer/base material/other pressure-sensitive adhesive layer/separator" was obtained. The resultant pressure-sensitive adhesive sheet was subjected to the evaluations (1) to (4). The results are shown in Table 1.

Example 10

The resin composition (II) prepared in Example 8 was applied to one surface of a PET base material (thickness: 50 μm) so as to have a thickness of 40 μm after drying, and was dried to form a pressure-sensitive adhesive layer. Further, a separator was bonded onto the pressure-sensitive adhesive layer.

Then, 100 parts by weight of a maleic acid-modified styrene-ethylene-butylene-styrene block copolymer (a) (SEBS: styrene moiety/ethylene-butylene moiety (weight ratio)=30/70, acid value: 10 (mg-CH$_3$ONa/g), manufactured by Asahi Kasei Chemicals Corporation, product name: "Tuftec M1913"), 50 parts by weight of a terpene phenol-based tackifying resin (manufactured by Yasuhara Chemical Co., Ltd., product name: "YS POLYSTER T80"), 3 parts by weight of an epoxy-based cross-linking agent (manufactured by Mitsubishi Gas Chemical Company, Inc., product name: "TETRAD-C"), 3 parts by weight of a phosphoric acid ester-based surfactant (manufactured by Toho Chemical Industry Co., Ltd., product name: "PHOSPHANOL RL210", molecular weight: 422.57, carbon number of alkyl group: 18), and toluene serving as a solvent were mixed to prepare a resin composition (II') (mixture).

The resin composition (II') was applied to the other surface of the PET base material so as to have a thickness of 10 μm after drying, and was dried to form another pressure-sensitive adhesive layer. Further, a separator was bonded onto the other pressure-sensitive adhesive layer.

Thus, a pressure-sensitive adhesive sheet having the layer configuration "separator/pressure-sensitive adhesive layer/base material/other pressure-sensitive adhesive layer/separator" was obtained. The resultant pressure-sensitive adhesive sheet was subjected to the evaluations (1) to (4). The results are shown in Table 1.

| | | | Example 1 | Example 2 | Example 3 | Example 4 | Example 5 |
|---|---|---|---|---|---|---|---|
| Pressure-sensitive adhesive layer | Composition | Base polymer | Styrene-based elastomer | Styrene-based elastomer | Styrene-based elastomer | Styrene-based elastomer | Styrene-based elastomer |
| | | Styrene ratio | 30 | 30 | 30 | 30 | 30 |
| | | Kind of tackifying resin | Terpene phenol-based | Terpene phenol-based | Terpene phenol-based | Terpene phenol-based | Terpene phenol-based |
| | | Addition amount (parts by weight) | 25 | 50 | 100 | 200 | 300 |
| | | Addition amount of thermally expandable microspheres (parts by weight) | 30 | 50 | 100 | 100 | 150 |
| | | Kind of surfactant | Phosphoric acid ester-based | Phosphoric acid ester-based | Phosphoric acid ester-based | Phosphoric acid ester-based | Phosphoric acid ester-based |
| | | Carbon number of alkyl group | 18 | 18 | 18 | 18 | 18 |
| | | Molecular weight/formula weight | 422.57 | 422.57 | 422.57 | 422.57 | 422.57 |
| | | Addition amount (parts by weight) | 3 | 3 | 3 | 3 | 3 |
| Base material layer | | Material | — | — | — | — | — |
| Other pressure-sensitive adhesive layer | Composition | Base polymer | — | — | — | — | — |
| | | Styrene ratio | — | — | — | — | — |
| | | Kind of tackifying resin | — | — | — | — | — |
| | | Addition amount (parts by weight) | — | — | — | — | — |
| | | Presence or absence of thermally expandable microspheres | — | — | — | — | — |
| Evaluation | | Shear adhesive strength at 25° C. (MPa) | 2.73 | 3.40 | 4.59 | 6.32 | 7.40 |
| | | Shear adhesive strength at 80° C. (MPa) | 0.91 | 0.91 | 0.96 | 0.77 | 0.49 |
| | | Microhardness (MPa) | 38.0 | 62.7 | 139.6 | 145.4 | 316.2 |
| | | Sapphire grindability | ○ | ○ | ○ | ○ | ○ |
| | | Heat peelability | ○ | ○ | ○ | ○ | ○ |

| | | | Example 6 | Example 7 | Example 8 | Example 9 | Example 10 |
|---|---|---|---|---|---|---|---|
| Pressure-sensitive adhesive layer | Composition | Base polymer | Styrene-based elastomer | Styrene-based elastomer | Styrene-based elastomer | Styrene-based elastomer | Styrene-based elastomer |
| | | Styrene ratio | 20 | 70 | 30 | 30 | 30 |
| | | Kind of tackifying resin | Terpene phenol-based | Terpene phenol-based | Terpene phenol-based | Terpene phenol-based | Terpene phenol-based |
| | | Addition amount (parts by weight) | 20 | 80 | 50 | 50 | 50 |
| | | Addition amount of thermally expandable microspheres (parts by weight) | 50 | 50 | 50 | 50 | 50 |
| | | Kind of surfactant | Phosphoric acid ester-based | Phosphoric acid ester-based | Phosphoric acid ester-based | Phosphoric acid ester-based | Phosphoric acid ester-based |
| | | Carbon number of alkyl group | 18 | 18 | 18 | 18 | 18 |
| | | Molecular weight/formula weight | 422.57 | 422.57 | 422.57 | 422.57 | 422.57 |
| | | Addition amount (parts by weight) | 3 | 3 | 3 | 3 | 3 |
| Base material layer | | Material | — | — | PET | PET | PET |
| Other pressure-sensitive adhesive layer | Composition | Base polymer | — | — | Acrylic resin | Styrene-based elastomer | Styrene-based elastomer |
| | | Styrene ratio | — | — | — | 30 | 30 |
| | | Kind of tackifying resin | — | — | — | Terpene phenol-based | Terpene phenol-based |
| | | Addition amount (parts by weight) | — | — | — | 50 | 50 |
| | | Presence or absence of thermally expandable microspheres | — | — | Absent | Present | Absent |

-continued

| Evaluation | | | | | |
|---|---|---|---|---|---|
| Shear adhesive strength at 25° C. (MPa) | 2.32 | 6.58 | 3.32 | 3.37 | 3.42 |
| Shear adhesive strength at 80° C. (MPa) | 0.52 | 2.25 | 0.90 | 1.36 | 0.93 |
| Microhardness (MPa) | 19.7 | 20.1 | 62.7 | 62.7 | 62.7 |
| Sapphire grindability | ○ | ○ | ○ | ○ | ○ |
| Heat peelability | ○ | ○ | ○ | ○ | ○ |

Examples 11 to 19

Pressure-sensitive adhesive sheets were obtained in the same manner as in Example 1 except that: the addition amounts of the tackifying resin and the thermally expandable microspheres were changed to amounts shown in Table 2; and surfactants shown in Table 2 were used in addition amounts shown in Table 2. The resultant pressure-sensitive adhesive sheets were subjected to the evaluations (1) to (4). The results are shown in Table 2. The surfactants used in Examples 11 to 19 are as described below.

Example 11: fatty acid ester-based surfactant; manufactured by Kao Corporation, product name: "EXCEPARL IPP", chemical formula: $C_{19}H_{38}O_2$, carbon number of alkyl group: 16, molecular weight: 298.50

Example 12: fatty acid amide-based surfactant; manufactured by Tokyo Chemical Industry Co., Ltd., stearamide, chemical formula: $C_{18}H_{37}NO$, carbon number of alkyl group: 18, molecular weight: 283.49

Example 13: fatty acid amide-based surfactant; manufactured by Tokyo Chemical Industry Co., Ltd., lauramide, chemical formula: $C_{12}H_{25}NO$, carbon number of alkyl group: 12, molecular weight: 199.33

Example 14: fatty acid aminoalkylamide-based surfactant; manufactured by Toho Chemical Industry Co., Ltd., product name: "CATINAL MAPS", chemical formula: $C_{23}H_{38}N_2O$, carbon number of alkyl group: 18, molecular weight: 358.56

Example 15: trimethylammonium chloride-based surfactant; manufactured by Toho Chemical Industry Co., Ltd., product name: "CATINAL STC-70ET", chemical formula: $C_{21}H_{46}ClN$, carbon number of alkyl group: 16, molecular weight: 348.04

Example 16: dimethylbenzylammonium chloride-based surfactant; manufactured by Sanyo Chemical Industries, Ltd., product name: "CATION S", chemical formula: $C_{26}H_{48}ClN$, carbon number of alkyl group: 18, molecular weight: 410.11

Example 17: succinic anhydride-based surfactant; manufactured by Sanyo Chemical Industries, Ltd., product name: "DSA", chemical formula: $C_{16}H_{26}O_3$, carbon number of alkyl group: 12, molecular weight: 266.37

Example 18: succinic anhydride-based surfactant; manufactured by Sanyo Chemical Industries, Ltd., product name: "PDSA-DA", chemical formula: $C_{19}H_{32}O_3$, carbon number of alkyl group: 15, molecular weight: 308.45

Example 19: sodium sulfosuccinate-based surfactant; manufactured by Sanyo Chemical Industries, Ltd., product name: "SANSEPARER 100", chemical formula: $C_{20}H_{27}O_7SNa$, carbon number of alkyl group: 6, molecular weight: 434.48

| | | | Example 11 | Example 12 | Example 13 | Example 14 | Example 15 | Example 16 | Example 17 | Example 18 | Example 19 |
|---|---|---|---|---|---|---|---|---|---|---|---|
| Pressure-sensitive adhesive layer | Composition | Base polymer | Styrene-based elastomer | Styrene-based elastomer | Styrene-based elastomer | Styrene-based elastomer | Styrene-based elastomer | Styrene-based elastomer | Styrene-based elastomer | Styrene-based elastomer | Styrene-based elastomer |
| | | Styrene ratio | 30 | 30 | 30 | 30 | 30 | 30 | 30 | 30 | 30 |
| | | Kind of tackifying resin | Terpene phenol-based | Terpene phenol-based | Terpene phenol-based | Terpene phenol-based | Terpene phenol-based | Terpene phenol-based | Terpene phenol-based | Terpene phenol-based | Terpene phenol-based |
| | | Addition amount (parts by weight) | 300 | 300 | 300 | 300 | 300 | 300 | 300 | 300 | 300 |
| | | Addition amount of thermally expandable microspheres (parts by weight) | 150 | 150 | 150 | 150 | 150 | 150 | 150 | 150 | 150 |
| | | Kind of surfactant | Fatty acid ester-based | Fatty acid ester-based | Fatty acid ester-based | Fatty acid aminoalkylamide-based | Trimethylammonium chloride-based | Dimethylbenzylammonium chloride-based | Succinic anhydride-based | Succinic anhydride-based | Sodium sulfosuccinate-based |
| | | Carbon number of alkyl group | 16 | 18 | 12 | 18 | 16 | 18 | 12 | 15 | 6 |
| | | Molecular weight/formula weight | 298.5 | 283.49 | 199.33 | 358.56 | 348.04 | 410.11 | 266.37 | 308.45 | 434.48 |
| | | Addition amount (parts by weight) | 5 | 0.001 | 0.01 | 5 | 3 | 3 | 3 | 3 | 3 |

-continued

|  |  | Example 11 | Example 12 | Example 13 | Example 14 | Example 15 | Example 16 | Example 17 | Example 18 | Example 19 |
|---|---|---|---|---|---|---|---|---|---|---|
| Evaluation | Shear adhesive strength at 25° C. (MPa) | 5.69 | 6.94 | 4.57 | 5.74 | 6.79 | 5.74 | 7.72 | 5.90 | 7.60 |
|  | Shear adhesive strength at 80° C. (MPa) | 0.34 | 0.55 | 0.47 | 0.41 | 0.40 | 0.40 | 0.48 | 0.47 | 0.48 |
|  | Microhardness (MPa) | 348.1 | 402.1 | 408.4 | 416.6 | 276.1 | 296.6 | 407.0 | 288.8 | 358.1 |
|  | Sapphire grindability | ○ | ○ | ○ | ○ | ○ | ○ | ○ | ○ | ○ |
|  | Heat peelability | ○ | ○ | ○ | ○ | ○ | ○ | ○ | ○ | ○ |

Comparative Example 1

100 Parts by weight of an ethylene-vinyl acetate copolymer resin (manufactured by Mitsubishi Chemical Corporation, product name: "EV-40 W"), 50 parts by weight of thermally expandable microspheres (manufactured by Matsumoto Yushi-Seiyaku Co., Ltd., product name: "Matsumoto Microsphere F-50D", foaming starting temperature: 120° C., average particle diameter: 14 μm), and toluene serving as a solvent were mixed to prepare a resin composition C1 (mixture). The resin composition C1 was applied onto a separator so as to have a thickness of 40 μm after drying, and was dried to form a pressure-sensitive adhesive layer. Further, the pressure-sensitive adhesive layer on the separator was bonded to another separator to produce a pressure-sensitive adhesive sheet having the layer configuration "separator/pressure-sensitive adhesive layer/separator".

The resultant pressure-sensitive adhesive sheet was subjected to the evaluations (1) to (4). The results are shown in Table 3.

Comparative Example 2

A pressure-sensitive adhesive sheet was obtained in the same manner as in Comparative Example 1 except that an ethylene-vinyl acetate copolymer resin (manufactured by Mitsubishi Chemical Corporation, product name: "EV-150") was used in place of the ethylene-vinyl acetate copolymer resin (manufactured by Mitsubishi Chemical Corporation, product name: "EV-40 W"). The resultant pressure-sensitive adhesive sheet was subjected to the evaluations (1) to (4). The results are shown in Table 3.

Comparative Example 3

100 Parts by weight of an acrylic resin (butyl acrylate-acrylic acid copolymer, butyl acrylate:acrylic acid (weight ratio)=100:5), 1 part by weight of a urethane-based cross-linking agent (manufactured by Nippon Polyurethane Industry Co., Ltd., product name: "Coronate L"), 30 parts by weight of thermally expandable microspheres (manufactured by Matsumoto Yushi-Seiyaku Co., Ltd., product name: "Matsumoto Microsphere F-50D", foaming starting temperature: 120° C., average particle diameter: 14 μm), and toluene serving as a solvent were mixed to prepare a resin composition C2. The resin composition C2 was applied onto a separator so as to have a thickness of 40 μm after drying, and was dried to form a pressure-sensitive adhesive layer. Further, the pressure-sensitive adhesive layer on the separator was bonded to another separator to produce a pressure-sensitive adhesive sheet having the layer configuration "separator/pressure-sensitive adhesive layer/separator".

The resultant pressure-sensitive adhesive sheet was subjected to the evaluations (1) to (4). The results are shown in Table 3.

TABLE 3

|  |  |  | Comparative Example 1 | Comparative Example 2 | Comparative Example 3 |
|---|---|---|---|---|---|
| Pressure-sensitive adhesive layer | Composition | Base polymer | EVA | EVA | Acrylic |
|  |  | Styrene ratio | — | — | — |
|  |  | Kind of tackifying resin | — | — | — |
|  |  | Addition amount (parts by weight) | — | — | — |
|  |  | Addition amount of thermally expandable microspheres (parts by weight) | 50 | 50 | 30 |
|  |  | Kind of surfactant | — | — | — |
|  |  | Carbon number of alkyl group | — | — | — |
|  |  | Molecular weight/formula weight | — | — | — |
|  |  | Addition amount (parts by weight) | — | — | — |

TABLE 3-continued

| | | Comparative Example 1 | Comparative Example 2 | Comparative Example 3 |
|---|---|---|---|---|
| Evaluation | Shear adhesive strength at 25° C. (MPa) | 0.99 | 0.75 | 0.62 |
| | Shear adhesive strength at 80° C. (MPa) | 0.17 | 0.11 | 0.10 |
| | Microhardness (MPa) | 7.2 | 1.5 | 9.9 |
| | Sapphire grindability | × | × | × |
| | Heat peelability | × | × | ○ |

REFERENCE SIGNS LIST 10 pressure-sensitive adhesive layer
20 base material
30 another pressure-sensitive adhesive layer
100, 200, 300 pressure-sensitive adhesive sheet

The invention claimed is:

1. A pressure-sensitive adhesive sheet, comprising a pressure-sensitive adhesive layer, and a light-peel layer in the pressure-sensitive adhesive layer,
wherein the pressure-sensitive adhesive layer contains:
a pressure-sensitive adhesive containing a base polymer;
a surfactant having a linear or branched alkyl group having 5 to 20 carbon atoms; and
a foaming agent having a foaming temperature of 90° C. or more,
wherein the light-peel layer is formed in the pressure-sensitive adhesive layer through segregation of the surfactant,
wherein the base polymer contained in the pressure-sensitive adhesive is a styrene-based elastomer, and
wherein the pressure-sensitive adhesive sheet has, when a pressure-sensitive adhesive surface thereof is bonded to a silicon chip, a shear adhesive strength of 1.0 MPa or more under an ambient temperature of 25° C., and a shear adhesive strength of 0.2 MPa to 5 MPa under an ambient temperature of 80° C.

2. The pressure-sensitive adhesive sheet according to claim 1, wherein the pressure-sensitive adhesive layer has a microhardness H of from 10 MPa to 1 GPa at 25° C.

3. The pressure-sensitive adhesive sheet according to claim 1, wherein the pressure-sensitive adhesive further contains a tackifying resin.

4. The pressure-sensitive adhesive sheet according to claim 3, wherein a content of the tackifying resin is from 20 parts by weight to 350 parts by weight with respect to 100 parts by weight of the base polymer.

5. The pressure-sensitive adhesive sheet according to claim 1, wherein a content of the surfactant is from 0.001 part by weight to 15 parts by weight with respect to 100 parts by weight of the base polymer.

6. The pressure-sensitive adhesive sheet according to claim 1, wherein thermally expandable microspheres are the foaming agent.

7. The pressure-sensitive adhesive sheet according to claim 6, wherein a content of the thermally expandable microspheres is from 20 parts by weight to 210 parts by weight with respect to 100 parts by weight of the base polymer.

8. The pressure-sensitive adhesive sheet according to claim 1, further comprising a base material arranged on at least one side of the pressure-sensitive adhesive layer.

9. The pressure-sensitive adhesive sheet according to claim 1, further comprising another pressure-sensitive adhesive layer arranged on at least one side of the pressure-sensitive adhesive layer.

10. The pressure-sensitive adhesive sheet according to claim 9, further comprising a base material, wherein the pressure-sensitive adhesive layer, the base material and the another pressure-sensitive adhesive layer are arranged in this order.

11. The pressure-sensitive adhesive sheet according to claim 1, wherein the pressure-sensitive adhesive sheet is for use as a temporary fixing material during substrate processing in a semiconductor manufacturing process.

12. A method of grinding a substrate, comprising placing and fixing a substrate onto a pressure-sensitive adhesive layer of a pressure-sensitive adhesive sheet including the pressure-sensitive adhesive layer and a light-peel layer in the pressure-sensitive adhesive layer, and then grinding a surface of the substrate on an opposite side to a pressure-sensitive adhesive layer side,
the pressure-sensitive adhesive layer containing:
a pressure-sensitive adhesive containing a base polymer;
a surfactant having a linear or branched alkyl group having 5 to 20 carbon atoms; and
a foaming agent having a foaming temperature of 90° C. or more,
wherein the light-peel layer is formed in the pressure-sensitive adhesive layer through segregation of the surfactant,
wherein the base polymer contained in the pressure-sensitive adhesive is a styrene-based elastomer, and
the pressure-sensitive adhesive sheet having, when a pressure-sensitive adhesive surface thereof is bonded to a silicon chip, a shear adhesive strength of 1.0 MPa or more under an ambient temperature of 25° C., and a shear adhesive strength of 0.2 MPa to 5 MPa under an ambient temperature of 80° C.

13. A method of manufacturing a chip, comprising a grinding step including placing and fixing a substrate onto a pressure-sensitive adhesive layer of a pressure-sensitive adhesive sheet including the pressure-sensitive adhesive layer and a light-peel layer in the pressure-sensitive adhesive layer, and then grinding a surface of the substrate on an opposite side to a pressure-sensitive adhesive layer side,
the pressure-sensitive adhesive layer containing:
a pressure-sensitive adhesive containing a base polymer;
a surfactant having a linear or branched alkyl group having 5 to 20 carbon atoms; and
a foaming agent having a foaming temperature of 90° C. or more,
wherein the light-peel layer is formed in the pressure-sensitive adhesive layer through segregation of the surfactant, wherein the base polymer contained in the pressure-sensitive adhesive is a styrene-based elastomer, and the pressure-sensitive adhesive sheet having, when a pressure-sensitive adhesive surface thereof is bonded to a silicon chip, a shear adhesive strength of 1.0 MPa or more under an ambient temperature of 25° C., and a shear adhesive strength of 0.2 MPa 5 MPa under an ambient temperature of 80° C.

\* \* \* \* \*